United States Patent
Yuan et al.

(10) Patent No.: US 7,466,776 B2
(45) Date of Patent: Dec. 16, 2008

(54) AUTOMATIC GAIN CONTROL METHOD AND APPARATUS IN COMMUNICATION SYSTEM HAVING DISCONTINUOUS TRANSMISSION MODE

(75) Inventors: Ti-Wen Yuan, Hsin-Chu County (TW); Wei-Sheng Yin, Tai-Tung Hsien (TW)

(73) Assignee: Mediatek Corporation, Hsin-Chu Hsien (TW)

( * ) Notice: Subject to any disclaimer, the term of this patent is extended or adjusted under 35 U.S.C. 154(b) by 680 days.

(21) Appl. No.: 10/708,941

(22) Filed: Apr. 2, 2004

(65) Prior Publication Data

US 2004/0196931 A1 Oct. 7, 2004

(30) Foreign Application Priority Data

Apr. 4, 2003 (TW) ............... 92107826 A

(51) Int. Cl.
*H04L 27/08* (2006.01)
(52) U.S. Cl. ............. 375/345; 375/295; 375/316; 375/343; 375/344; 375/348
(58) Field of Classification Search ......... 375/345, 375/352, 136–137, 145–147, 295, 316, 317, 375/344, 348, 350; 455/67.1, 232.1
See application file for complete search history.

(56) References Cited

U.S. PATENT DOCUMENTS

| | | | | |
|---|---|---|---|---|
| 3,934,204 A | * | 1/1976 | Hill | 455/136 |
| 5,083,304 A | * | 1/1992 | Cahill | 375/345 |
| 5,301,364 A | * | 4/1994 | Arens et al. | 455/69 |
| 6,052,566 A | * | 4/2000 | Abramsky et al. | 455/67.11 |
| 2001/0055350 A1 | * | 12/2001 | Higure | 375/345 |
| 2002/0163980 A1 | * | 11/2002 | Ruohonen | 375/345 |
| 2003/0026363 A1 | * | 2/2003 | Stoter et al. | 375/345 |
| 2003/0128744 A1 | * | 7/2003 | Yeo et al. | 375/147 |
| 2003/0194029 A1 | * | 10/2003 | Heinonen et al. | 375/345 |
| 2005/0003783 A1 | * | 1/2005 | Ben-Ayun et al. | 455/232.1 |

* cited by examiner

*Primary Examiner*—Shuwang Liu
*Assistant Examiner*—Hirdepal Singh
(74) *Attorney, Agent, or Firm*—Winston Hsu

(57) ABSTRACT

An automatic gain control method used in a wireless receiver is disclosed. The method comprise the following steps: Receiving a first frame, amplifying a RF signal corresponding to the first frame with a gain value and down converting the RF signal to generate a baseband signal. Updating the gain value according to the power level of the baseband signal corresponding to the first frame, then using the updated gain value to amplify the RF signal corresponding to a second frame when receiving the second frame. Determining whether a first signal block is in the discontinuous transmission mode or not, wherein the first frame belongs to the first signal block. And resuming the gain value according to the power level of the baseband signal corresponding to a third frame if the first signal block is in the discontinuous transmission mode.

24 Claims, 4 Drawing Sheets

AUTOMATIC GAIN CONTROL METHOD AND APPARATUS IN COMMUNICATION SYSTEM HAVING DISCONTINUOUS TRANSMISSION MODE

BACKGROUND OF INVENTION

1. Field of the Invention

The present invention relates to an automatic gain control method, and more specifically, to an automatic gain control method capable of detecting transmission mode and perform gain control in a communication system having a discontinuous transmission mode.

2. Description of the Prior Art

In frame based wireless communication systems, a typical transmission method is to interleave data into a plurality of frames and organize the frames to form a plurality of signal blocks. For a receiver to receive the signal transmitted by a transmitter correctly, the transmitter and receiver must modulate and demodulate synchronously.

Please refer to FIG. 1. FIG. 1 is a schematic diagram illustrating a 104-frame structure (B0-B23) of the GSM (Global System for Mobile Communication) system. In FIG. 1, the frames marked S denotes the SACCH control frames and the frames marked I denotes the Idle frames. In the digital wireless communication system according to the prior art, when the transmitter is in a discontinuous transmission mode (DTX mode), the automatic gain control unit in the receiver can use at most 12 specific frames to perform gain control. These 12 specific frames include 4 SACCH (Slow-Associated Control Channel control frames that are between the blocks B5 and B6, the blocks B11 and B12, the blocks B17 and B18, and the blocks B23 and the block B0 of the next 104-frame structure, and 8 SID frames (Silence Information Description Frame) that are between the block B12 and B13. In addition, the gain estimated according to the SACCH frame between the blocks B5 and B6 is used as the initial gain value for receiving the blocks B6 to B11. The gain estimated according to the SACCH frames between the blocks B11 and B12 and between the blocks B12 and B13 is used as the initial gain value for receiving the blocks from B14 to B17. The gain estimated according to the SACCH frame between the blocks B17 and B18 is used as the initial gain value for receiving the blocks B18 to B23. In addition, the gain estimated according to the SACCH frame between the blocks B23 and B0 in the next 104-frame structure is used as the initial gain value for receiving the blocks B0 to B5 in the next 104-frame structure.

As shown in FIG. 1, in the digital wireless communication system according to the prior art, the gain controlling process depends only on 4 SACCH control frames and 8 SID frames no matter the transmission is in the DTX mode or not. In practical, the number of the frames utilized by the prior art is too small. That is the sample space for the gain control algorithm is too small such that the gain tracking speed is slow and the tracking accuracy is poor. It is desired to have an automatic gain control method which is capable of utilize those frames as much as possible to enlarge the sample space and achieve a better gain control.

SUMMARY OF INVENTION

It is therefore an objective of the claimed invention to provide a wireless receiver for detecting transmission mode of communication signal and control gain automatically.

According to the claimed invention, an automatic gain control method used in a wireless receiver is disclosed. The wireless receiver is for receiving a plurality of signal blocks sent by a wireless transmitter. Each of the plurality of signal blocks comprises at least one frame. The wireless transmitter has a discontinuous transmission mode. The method comprise the following steps: Receiving a first frame, amplifying a RF signal corresponding to the first frame with a gain value and down converting the RF signal to generate a baseband signal. Updating the gain value according to the power level of the baseband signal corresponding to the first frame, then using the updated gain value to amplify the RF signal corresponding to a second frame when receiving the second frame. Determining whether a first signal block is in the discontinuous transmission mode or not, wherein the first frame belongs to the first signal block. And resuming the gain value according to the power level of the baseband signal corresponding to a third frame if the first signal block is in the discontinuous transmission mode. Wherein the third frame belongs to a third signal block which is sent before the first signal block, and the third signal block is not in the discontinuous transmission mode.

Also according to the claimed invention, a wireless receiver is disclosed. The wireless receiver is for receiving a plurality of signal blocks sent by a wireless transmitter. Each of the plurality of signal blocks comprises at least one frame. The wireless transmitter has a discontinuous transmission mode. The wireless receiver comprises an antenna, a receiver module, a discontinuous transmission detection module, and a gain control module. The antenna is for receiving a RF signal corresponding to a first frame of a first signal block sent by the wireless transmitter. The receiver module is connected to the antenna, for amplifying the RF signal corresponding to the first frame with a gain value and down converting the RF signal to generate a baseband signal. The discontinuous transmission detection module is connected to the receiver module for determining whether the first signal block is in the discontinuous transmission mode or not. The gain control module is connected to the receiver module and the discontinuous transmission detection module for adjusting the gain value used by the receiver module. Wherein after receiving the first frame of the first signal block, the gain control module updates the gain value according to the power level of the baseband signal corresponding to the first frame; then the receiver module uses the updated gain value to amplify the RF signal corresponding to a second frame when receiving the second frame; and if the discontinuous transmission detection module determines that the first signal block is in the discontinuous transmission mode, the gain control module resumes the gain value according to the power level of the baseband signal corresponding to a third frame that belongs to a third signal block sent before the first signal block and the third signal block is not in the discontinuous transmission mode.

Further according to the claimed invention, an automatic gain control apparatus applied in a wireless receiver is disclosed. The wireless receiver receives a plurality of signal blocks sent by a wireless transmitter, each of the plurality of signal blocks comprises at least one frame. The wireless receiver includes a receiver module for amplifying a received RF signal corresponding to a first frame with a gain value and down converting the RF signal to generate a baseband signal. The wireless transmitter has a discontinuous transmission mode. The disclosed apparatus comprises a discontinuous transmission detection module and a gain control module. The discontinuous transmission detection module is connected to the receiver module, for determining whether a first signal block is in the discontinuous transmission mode or not, wherein the first signal block contains the first frame. The gain control module is connected to the receiver module and the discontinuous transmission detection module, for adjusting the gain value used by the receiver module. Wherein after receiving the first frame of the first signal block, the gain control module updates the gain value according to the power level of the baseband signal corresponding to the first frame. Then the receiver module uses the updated gain value for amplifying the RF signal corresponding to a second frame when receiving the second frame. If the discontinuous transmission detection module determines that the first signal block is in the discontinuous transmission mode, the gain control module resumes the gain value according to the power level of the baseband signal corresponding to a third frame that belongs to a third signal block sent before the first signal block and the third signal block is not in the discontinuous transmission mode.

These and other objectives of the claimed invention will no doubt become obvious to those of ordinary skill in the art after reading the following

DETAILED DESCRIPTION

Figure 1:
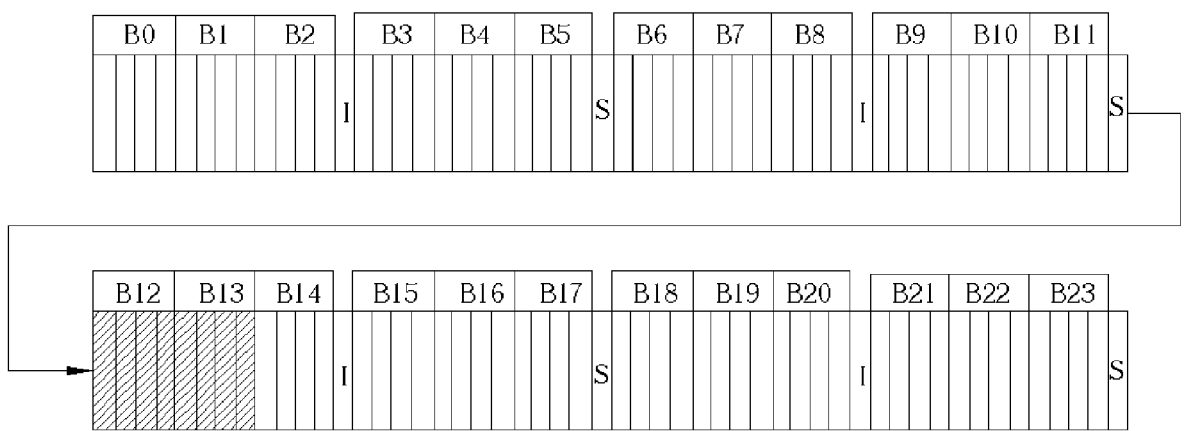
FIG. 1 is a schematic diagram of a 104-frame structure of a GSM system.
Figure 2:
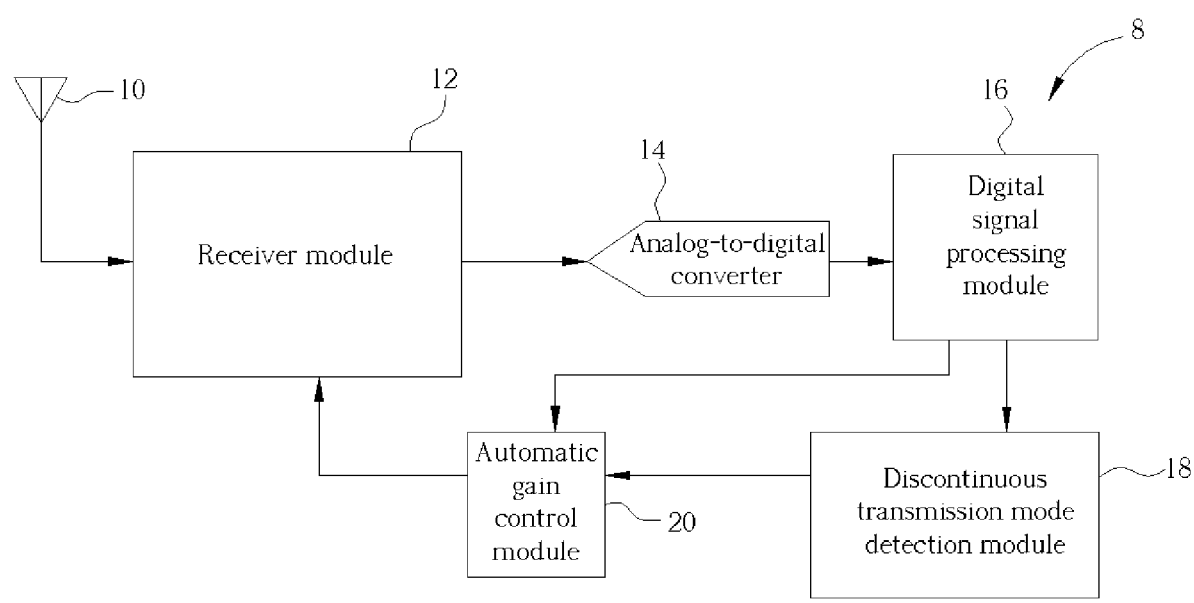
FIG. 2 is a block diagram of a wireless receiver according to the present invention.

Please refer to FIG. 2. FIG. 2 is a block diagram of a wireless receiver 8 according to the present invention. The wireless receiver 8 comprises an antenna 10, a receiver module 12, an analog-to-digital converter 14, a digital signal processing module 16, a discontinuous transmission mode detection module 18, and an automatic gain control module 20. The antenna 10 is for receiving the RF signal sent by a transmitter (not shown). The receiver module 12 is connected to the antenna 10, for amplifying the RF signal received by the antenna 10 and down converting the RF signal into an analog baseband signal. The analog-to-digital converter 14 is connected to the receiver module 12, for transforming the analog baseband signal output by the receiver module 12 into a digital signal. The digital signal processing module 16 is connected to the analog-to-digital converter 14, for estimating a signal quality metric and a power level of the analog baseband signal corresponding to the received frame. The signal quality metric acts as an indicator reflecting the quality of the received frame. The discontinuous transmission (DTX) detection module 18 is connected to the digital signal processing module 14, for determining whether the received signal block is in the discontinuous transmission mode (DTX mode) or not according to the estimated signal quality metric of each frame in the signal block The automatic gain control module 20 is connected to the digital signal processing module 16, the discontinuous transmission detection module 18 and the receiver module 12. The automatic gain control module 20 is used for adjusting the gain value used by the receiver module 12 according to the estimated power level of the analog baseband signal that is the input signal of the analog-to-digital converter 14 and also according to the output of the DTX detection module 18.

Figure 3:
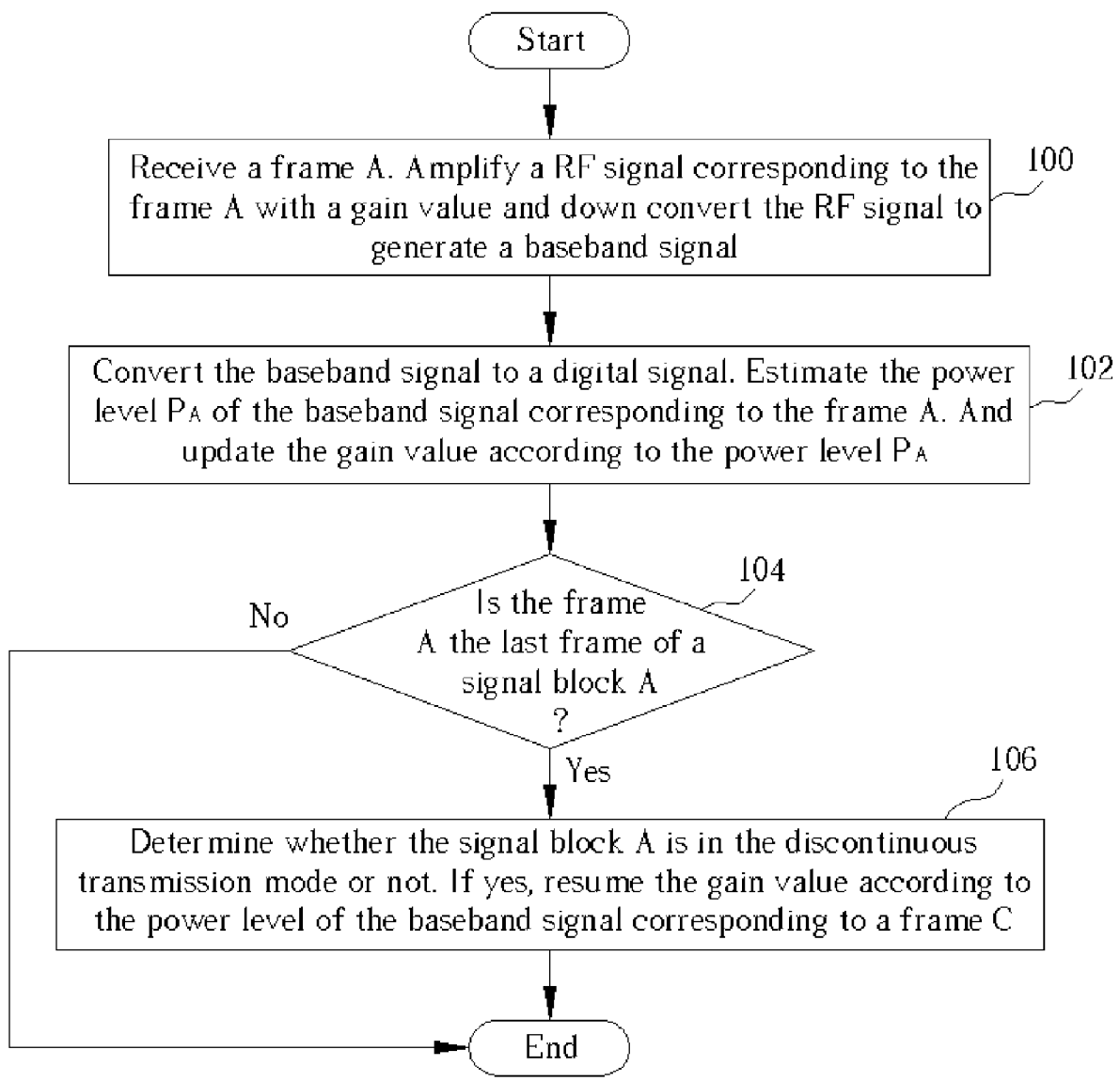
FIG. 3 is a flowchart showing how the wireless receiver of FIG. 2 controlling the gain value.

Please refer to FIG. 3. FIG. 3 shows a flowchart for adjusting the gain value used by the receiver module 12 according to the present invention. The steps are shown as follows:

Step 100: Receive a frame A via the antenna 10. Use the receiver module 12 to amplify a RF signal corresponding to the frame A with a gain value and down convert the RF signal to generate a baseband signal.

Step 102: Convert the baseband signal to a digital signal via the analog-to-digital converter 14. Use the digital signal processing module 16 to estimate the power level PA of the baseband signal corresponding to the frame A. And use the automatic gain control module 20 to update the gain value according to the power level PA. If the power level PA is smaller than a desired power level, increase the gain value. Otherwise decrease the gain value. The updated gain value is for amplifying a RF signal corresponding to a second frame B when receiving the second frame B.

Step 104: Determine whether the frame A is the last frame of a signal block A. If yes, further perform step 106.

Step 106: Use the discontinuous transmission mode detection module 18 to determine whether the signal block A is in the discontinuous transmission mode or not. If yes, use the automatic gain control module 20 to resume the gain value according to the power level of the baseband signal corresponding to a frame C, wherein the frame C belongs to a signal block C which is sent before the signal block A, and the signal block C is not in the discontinuous transmission mode.

The present invention is applicable to either a single carrier system or a frequency-hopping system. To speak more specifically, the wireless transmitter can use a single channel frequency to transmit the RF signal. In this situation the frame B denotes the one sent immediately after the frame A, and the frame C denotes the last frame of the signal block C. In the second case, that is the transmitter transmits the RF signal in a frequency hopping manner, the frame A, B, and C all correspond to the same frequency channel $CH_A$ used by the wireless communication system. To speak more specifically, the frame B denotes the next frame after the frame A over the frequency channel $CH_A$ and the frame C denotes the last frame that is over the frequency channel $CH_A$ in the signal block C.

Figure 4:
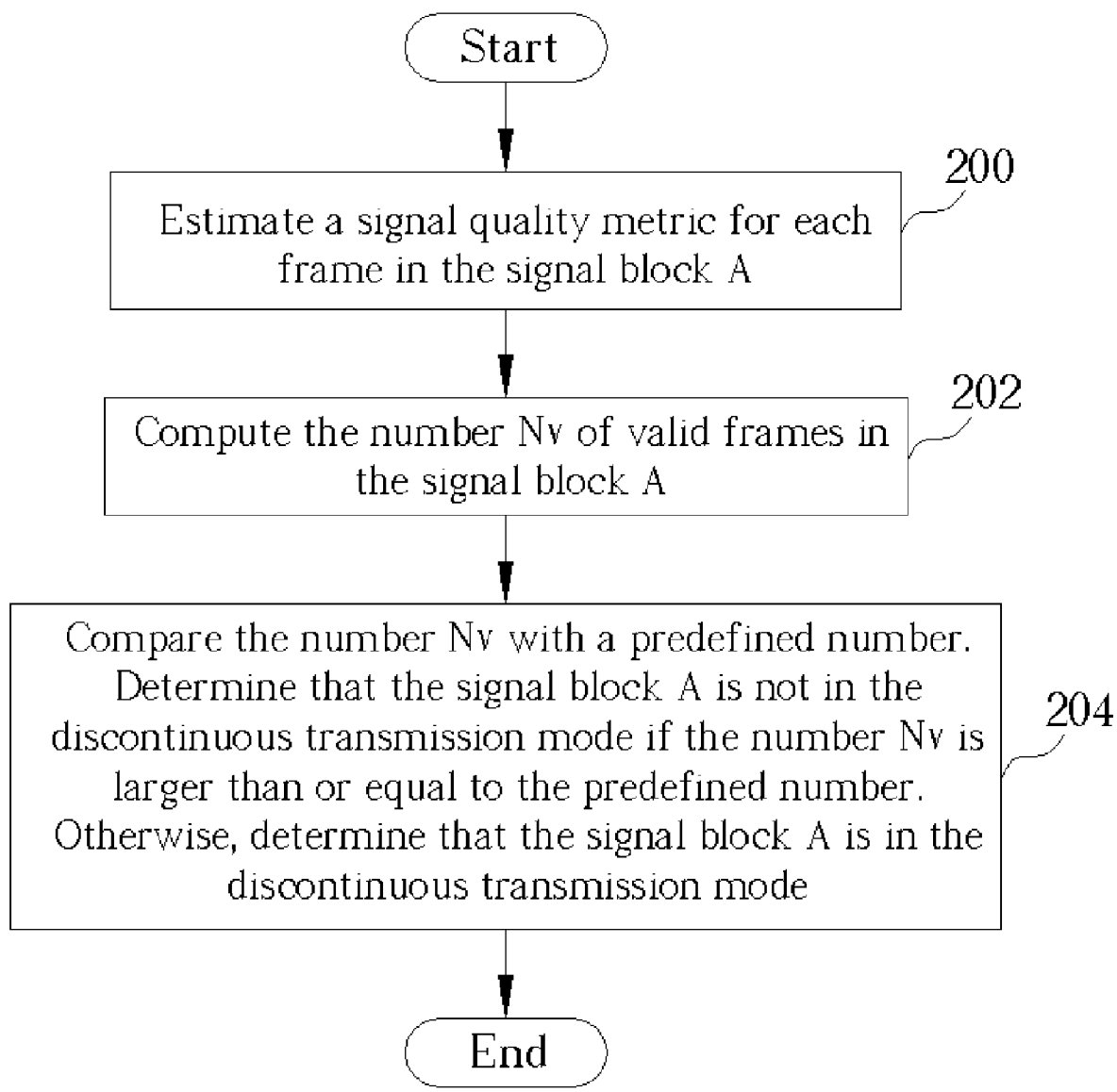
FIG. 4 is a flowchart showing how the DTX module of FIG. 2 determines whether a signal block is in the DTX mode.

Please refer to FIG. 4 that illustrates how the discontinuous transmission mode detection module 18 determines whether the signal block A is in the discontinuous transmission mode or not. The steps are shown as follows:

Step 200: Estimate a signal quality metric for each frame in the signal block A. If a frame has a signal quality metric which is larger than a predefined quality metric, then the frame is regarded as a valid frame. Otherwise, it is regarded as an invalid frame.

Step 202: Compute the number $N_V$ of valid frames in the signal block A.

Step 204: Compare the number $N_V$ with a predefined number. Determine that the signal block A is not in the discontinuous transmission mode if the number $N_V$ is larger than or equal to the predefined number. Otherwise, determine that the signal block A is in the discontinuous transmission mode.

In the above description, the signal quality metric associated with a frame can be any kind of metric that could reflect the signal quality of the frame. As an example, the signal quality metric is a signal-to-noise ratio of the frame. As another example, the signal quality metric is a signal power level of the frame.

Please note that although the above paragraphs illustrate the present invention with a wireless receiver 8 in a GSM/GPRS (General Packet Radio Service) system, the present invention can also be applied to any other communication system which has a property of discontinuous transmission and needs to control the power level of the analog baseband signal to be around a desired level.

In the case of GSM/GPRS system, the prior art only utilizes 12 frames from the 104 frames to perform gain controlling. However, with the discontinuous transmission mode detection module 18 and the gain control method shown in FIG. 3, the present invention can utilize all the frames in a signal block which are not in discontinuous transmission mode as samples for performing gain control. With larger sample space, the gain control according to the present invention will achieve a faster tracking speed and a better tracking accuracy than the prior art.

Those skilled in the art will readily observe that numerous modifications and alterations of the device may be made while retaining the teachings of the invention. Accordingly, the above disclosure should be constructed as limited only by the metes and bounds of the appended claims.

What is claimed is:

1. An automatic gain control method used in a wireless receiver, the wireless receiver being for receiving a plurality of signal blocks sent by a wireless transmitter, each of the plurality of signal blocks comprising at least one frame, the wireless transmitter having a discontinuous transmission mode, the method comprising:

receiving a first frame, amplifying a RF signal corresponding to the first frame with a gain value and down converting the RF signal to generate a baseband signal;

updating the gain value according to the power level of the baseband signal corresponding to the first frame, wherein the updated gain value is for amplifying the RF signal corresponding to a second frame when receiving the second frame;

determining whether a first signal block is in the discontinuous transmission mode or not, wherein the first frame belongs to the first signal block, wherein determining whether the first signal block is in the discontinuous transmission mode or not further comprises:

computing a first number of valid frames belonged to the first signal block;

comparing the first number with a predefined number;

determining that the first signal block is not in the discontinuous transmission mode if the first number is larger than or equal to the predefined number; and determining that the first signal block is in the discontinuous transmission mode if the first number is smaller than the predefined number; and resuming the gain value according to the power level of the baseband signal corresponding to a third frame if the first signal block is in the discontinuous transmission mode;

wherein the third frame belongs to a third signal block which is sent before the first signal block and the third signal block is not in the discontinuous transmission mode.

2. The automatic gain control method of claim 1, wherein:
the wireless transmitter transmits the RF signal in a frequency hopping manner; and
the first frame, the second frame, and the third frame correspond to the same channel frequency.

3. The automatic gain control method of claim 1, wherein:
the wireless transmitter transmits the RF signal with a single channel frequency;
the second frame is the one sent immediately after the first frame; and
the third frame is the last frame of the third signal block.

4. The automatic gain control method of claim 1, wherein computing the first number of valid frames belonged to the first signal block further comprises:

estimating a signal quality metric for each frame belonged to the first signal block;

if a frame has a signal quality metric which is larger than a predefined quality metric, then regarding the frame as a valid frame; and computing the first number of valid frames belonged to the first signal block.

5. The automatic gain control method of claim 4, wherein the signal quality metric is a signal-to-noise ratio of the frame belonged to the first signal block.

6. The automatic gain control method of claim 4, wherein the signal quality metric is a signal power level of the frame belonged to the first signal block.

7. The automatic gain control method of claim 1, wherein updating the gain value according to the power level of the baseband signal corresponding to the first frame further comprises:

comparing the power level of the baseband signal corresponding to the first frame with a desired power level;

increasing the gain value if the power level of the baseband signal corresponding to the first frame is smaller than the desired power level; and decreasing the gain value if the power level of the baseband signal corresponding to the first frame is not smaller than the desired power level.

8. The automatic gain control method of claim 7, wherein the baseband signal corresponding to the first frame is an input signal of an analog-to-digital converter used in the wireless receiver.

9. A wireless receiver for receiving a plurality of signal blocks sent by a wireless transmitter, each of the plurality of signal blocks comprising at least one frame, the wireless transmitter having a discontinuous transmission mode, the wireless receiver comprising:

an antenna for receiving a RF signal corresponding to a first frame of a first signal block sent by the wireless transmitter;

a receiver module connected to the antenna for amplifying the RF signal corresponding to the first frame with a gain value and down converting the RF signal to generate a baseband signal;

a discontinuous transmission detection module connected to the receiver module for determining whether the first signal block is in the discontinuous transmission mode or not by comparing a first number with a predefined number; the first number corresponds to the number of valid frames belonged to the first signal block; if the first number is not smaller than the predefined number, then the discontinuous transmission detection module determines that the first signal block is not in the discontinuous transmission mode, otherwise the discontinuous transmission detection module determines that the first signal block is in the discontinuous transmission mode;

a gain control module connected to the receiver module and the discontinuous transmission detection module for adjusting the gain value used by the receiver module;

wherein after receiving the first frame of the first signal block, the gain control module updates the gain value according to the power level of the baseband signal corresponding to the first frame; then the receiver module uses the updated gain value for amplifying the RF signal corresponding to a second frame when receiving the second frame; and if the discontinuous transmission detection module determines that the first signal block is in the discontinuous transmission mode, the gain control module resumes the gain value according to the power level of the baseband signal corresponding to a third frame that belongs to a third signal block sent before the first signal block and the third signal block is not in the discontinuous transmission mode.

10. The wireless receiver of claim 9, wherein:
the wireless transmitter transmits the RF signal in a frequency hopping manner; and
the first frame, the second frame, and the third frame correspond to the same channel frequency.

11. The wireless receiver of claim 9, wherein:
the wireless transmitter transmits the RF signal with a single channel frequency;
the second frame is the one sent immediately after the first frame; and
the third frame is the last frame of the third signal block.

12. The wireless receiver claim 9, wherein for computing the first number of valid frames belong to the first signal block, the discontinuous transmission detection module estimates a signal quality metric for each frame belonged to the first signal block; if a frame has a signal quality metric which is larger than a predefined quality metric, then the discontinuous transmission detection module regards the frame as a valid frame.

13. The wireless receiver of claim 12, wherein the signal quality metric is a signal-to-noise ratio of the frame belonged to the first signal block.

14. The wireless receiver of claim 12, wherein the signal quality metric is a signal power level of the frame belonged to the first signal block.

15. The wireless receiver of claim 9, wherein for updating the gain value according to the power level of the baseband signal corresponding to the first frame, the gain control module compares the power level of the baseband signal corresponding to the first frame with a desired power level, and increases the gain value if the power level of the baseband signal corresponding to the first frame is smaller than the desired power level, otherwise the gain control module decreases the gain value.

16. The wireless receiver of claim 9, wherein the wireless receiver further comprises an analog-to-digital converter for converting the baseband signal corresponding to the first frame to a digital signal.

17. An automatic gain control apparatus applied in a wireless receiver, the wireless receiver receiving a plurality of signal blocks sent by a wireless transmitter, each of the plurality of signal blocks comprising at least one frame, the wireless receiver having a receiver module for amplifying a received RF signal corresponding to a first frame with a gain value and down converting the RF signal to generate a baseband signal, the wireless transmitter having a discontinuous transmission mode, the apparatus comprising:
a discontinuous transmission detection module connected to the receiver module for determining whether a first signal block is in the discontinuous transmission mode or not, wherein the first signal block contains the first frame, wherein the discontinuous transmission detection module determines whether a first signal block is in the discontinuous transmission mode or not by comparing a first number with a predefined number; the first number corresponds to the number of valid frames belonged to the first signal block; if the first number is not smaller than the predefined number, then the discontinuous transmission detection module determines that the first signal block is not in the discontinuous transmission mode, otherwise the discontinuous transmission detection module determines that the first signal block is in the discontinuous transmission mode;
a gain control module connected to the receiver module and the discontinuous transmission detection module for adjusting the gain value used by the receiver module;
wherein after receiving the first frame of the first signal block, the gain control module updates the gain value according to the power level of the baseband signal corresponding to the first frame; then the receiver module uses the updated gain value for amplifying the RF signal corresponding to a second frame when receiving the second frame; and if the discontinuous transmission detection module determines that the first signal block is in the discontinuous transmission mode, the gain control module resumes the gain value according to the power level of the baseband signal corresponding to a third frame that belongs to a third signal block sent before the first signal block and the third signal block is not in the discontinuous transmission mode.

18. The automatic gain control apparatus of claim 17, wherein:
the wireless transmitter transmits the RF signal in a frequency hopping manner; and
the first frame, the second frame, and the third frame correspond to the same channel frequency.

19. The automatic gain control apparatus of claim 17, wherein:
the wireless transmitter transmits the RF signal with a single channel frequency;
the second frame is the one sent immediately after the first frame; and
the third frame is the last frame of the third signal block.

20. The automatic gain control apparatus of claim 17, wherein for computing the first number of valid frames belong to the first signal block, the discontinuous transmission detection module estimates a signal quality metric for each frame belonged to the first signal block; if a frame has a signal quality metric which is larger than a predefined quality metric, then the discontinuous transmission detection module regards the frame as a valid frame.

21. The automatic gain control apparatus of claim 20, wherein the signal quality metric is a signal-to-noise ratio of the frame belonged to the first signal block.

22. The automatic gain control apparatus of claim 20, wherein the signal quality metric is a signal power level of the frame belonged to the first signal block.

23. The automatic gain control apparatus of claim 17, wherein for updating the gain value according to the power level of the baseband signal corresponding to the first frame, the gain control module compares the power level of the baseband signal corresponding to the first frame with a desired power level, and increases the gain value if the power level of the baseband signal corresponding to the first frame is smaller than the desired power level, otherwise the gain control module decreases the gain value.

24. The automatic gain control apparatus of claim 17, wherein the wireless receiver further comprises an analog-to-digital converter for converting the baseband signal corresponding to the first frame to a digital signal.

* * * * *

UNITED STATES PATENT AND TRADEMARK OFFICE
CERTIFICATE OF CORRECTION

| | |
|---|---|
| PATENT NO. | : 7,466,776 B2 |
| APPLICATION NO. | : 10/708941 |
| DATED | : December 16, 2008 |
| INVENTOR(S) | : Ti-Wen Yuan and Wei-Sheng Yin |

It is certified that error appears in the above-identified patent and that said Letters Patent is hereby corrected as shown below:

On the title page, item (73), the name of the assignee should read as follows: "Mediatek Incorporation."

Signed and Sealed this

Seventeenth Day of February, 2009

JOHN DOLL
*Acting Director of the United States Patent and Trademark Office*